United States Patent [19]
Bawolek et al.

[11] Patent Number: 6,020,582
[45] Date of Patent: Feb. 1, 2000

[54] LIGHT SELECTIVE ELEMENT FOR IMAGING APPLICATIONS

[75] Inventors: Edward J. Bawolek, Chandler; Kabul Sengupta, Tempe; Zong-Fu Li, Gilbert; Curtis Corum, Chandler, all of Ariz.

[73] Assignee: Intel Corporation, Santa Clara, Calif.

[21] Appl. No.: 09/052,205

[22] Filed: Mar. 31, 1998

[51] Int. Cl.⁷ ........................................ H01J 5/02
[52] U.S. Cl. ................. 250/208.1; 250/239; 257/433
[58] Field of Search ................. 250/208.1, 214.1, 250/216, 239; 257/80–84, 432–434

[56] References Cited

U.S. PATENT DOCUMENTS

| 5,543,612 | 8/1996 | Kanaya et al. ................ 250/208.1 |
| 5,682,266 | 10/1997 | Meyers ................ 250/208.1 |
| 5,821,532 | 10/1998 | Beaman et al. ................ 250/239 |

OTHER PUBLICATIONS

Redacted Transcription of Trip Report to EG&G Reticon, May 16, 1996.
"IR Cut Filter Plastics," Kureha Chemical Industry Co., Ltd., 1997.
Hoya Optics, "Material Safety Data Sheet," CM–500 Inorganic Glass, Mar. 1993.
J.L. Herbert and N. Saha, "Application of Silanes for Promoting Resist Patterning Layer Adhesion in Semiconductor Manufacturing ," J. Adhesion Sci. Technol., vol. 5, No. 10(1991), pp. 905–925.
K.L. Mittal, "Factors, Affecting Adhesion of Lithographic Materials ," Solid State Technology, May 1979, pp. 89–97.
M.E. Bartram, A.J. Howard, A.G. Baca, R.J. Shul, and D.J. Rieger, "A New Method for Promoting Photoresist Adhesion on Tungsten Films for Self–Aligned Refractory Gates on GaAs ," J. Electrochem. Soc., vol. 140, No. 10, Oct. 1993, pp. 2998–3000.

*Primary Examiner*—Stephone Allen
*Attorney, Agent, or Firm*—Blakely, Sokoloff, Taylor & Zafman LLP

[57] ABSTRACT

An image sensing device including a package having opposing side portions, an imaging sensor having a top side portion, and a light selective element coupled to the opposing side portions and overlying the top side portion of the imaging sensor.

22 Claims, 5 Drawing Sheets

LIGHT SELECTIVE ELEMENT FOR IMAGING APPLICATIONS

BACKGROUND OF THE INVENTION

1. Field of the Invention

The invention relates to imaging systems and more particularly to packaging for image sensing devices.

2. Description of Related Art

Image sensing devices generally are characterized as the light detecting component in digital imaging systems. An image sensing device in a camera, for example, uses light to capture an image so as to replace traditional film-based systems. In a camera, an image sensing device is configured to capture a monochrome or color image by way of field effect transistor (FET) or diode devices, fabricated with complementary metal oxide semiconductor (CMOS) devices or charge couple device (CCD) technology.

Imaging systems built with CCD or CMOS based sensors generally require an infrared (IR) selective filter as part of the optical system. This need arises because the most common semiconductor-based image sensing devices, silicon-based image sensing devices respond not only to visible light (approximately 380 to 780 nanometers), but also to infrared light in the range of approximately 780 to 1100 nanometers. Without an infrared blocking filter, it is virtually impossible to obtain a high-quality color image due to the combination of visible and IR signals. Monochrome imagers also require an IR selective filter to correctly preserve scene luminance.

Typically, digital imaging systems incorporate an IR filter, typically glass or plastic, as part of the optical train, i.e., somewhere in the optical system apart from the image sensing device and either overlying the lens or interposed within other optical elements. The disadvantage of the inclusion of a separate IR selective filter is that it adds an additional component to the total system count, i.e., piece-part count. The inclusion of an additional component must be accommodated thereby adding additional complexity to the imaging system. Further, depending on where the IR selective filter is placed, there is a size consideration that directly affects the cost of the imaging system. The system software and signal processing must also be adjusted to accommodate the color performance characteristics of the IR selective filter. Still further, if the IR selective filter is placed, for example, in front of the lens, the IR selective filter is exposed to the environment and therefore presents the risk of damage by the environment, such as for example moisture or scratching.

SUMMARY OF THE INVENTION

An image sensing device is disclosed. The image sensing device includes a package having opposing side portions, the package including an imaging sensor having a top side portion, and a light selective element coupled to the opposing side portions and overlying the top side portion of the imaging sensor.

DETAILED DESCRIPTION OF THE INVENTION

An image sensing device including a package having a light selective (e.g., absorptive or reflective) element or filter integrated into the package is disclosed. In one aspect of the invention, the light selective element is an IR light selective element. In another aspect of the invention, the light selective element is either an ionically-coated glass, a surface-treated glass, or a plastic substrate. In still another aspect of the invention, the light selective element is glass coated with an IR light selective coating. In a further aspect of the invention, an imaging system incorporating a sensor package having a glass substrate overlying the top surface of the package is disclosed. These and other aspects are discussed with reference to the figures.

Figure 1:
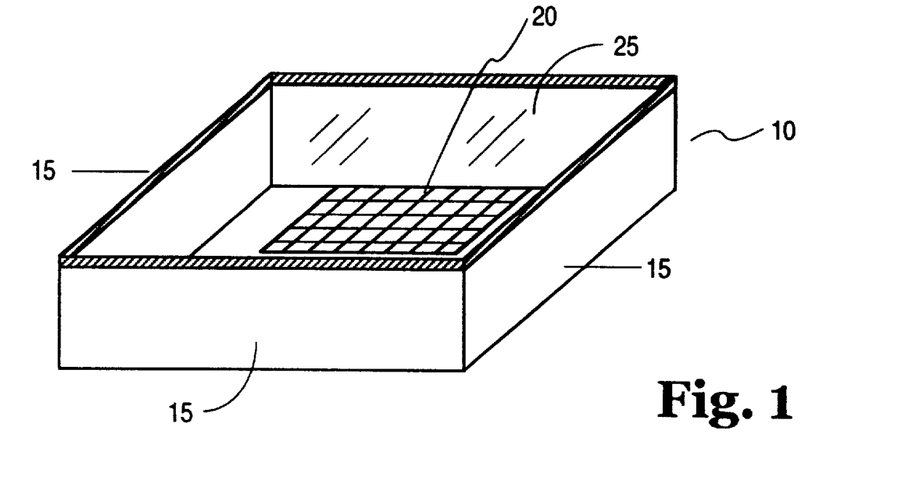
FIG. 1 illustrates an image sensing device in accordance with an embodiment of the invention.

FIG. 1 illustrates a top-perspective view of an image sensing device of the invention. FIG. 1 shows an image sensing device 10 made up of a package 15 having opposing side wall portions and containing an imaging sensor 20 such as an array of light-absorbing pixels. Imaging sensor 20 is embedded into and is affixed by its bottom surface to package 15. The top surface of image sensor 20 includes a plurality of pixels, for example, 640 columns by 480 rows of pixels.

Figure 2:
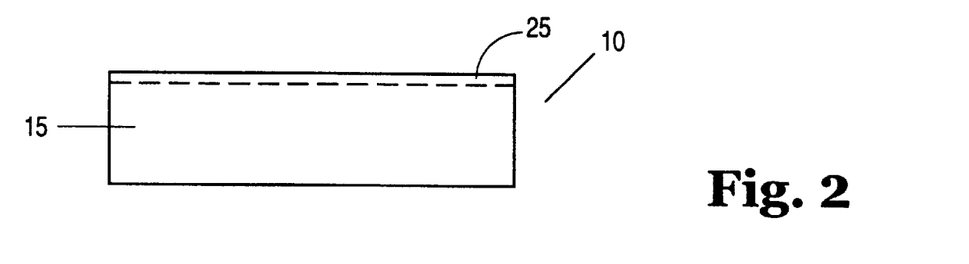
FIG. 2 is a planar side view of the structure of FIG. 1 in accordance with the invention.

FIG. 2 shows a planar side view portion of the image sensing device of FIG. 1. In one embodiment, package 15 is made up of a durable material, such as for example a plastic material. The durable plastic package resists expansion and deformation in the presence of extreme temperatures to which image sensing device 10 may be exposed. In this embodiment, image sensor 20 is affixed to the bottom of package 15 by an epoxy.

The top surface of package 15 is an IR light selective element or filter 25. As illustrated in FIGS. 1 and 2, IR light selective element or filter 25 is affixed directly to the top of the opposing side portions of package 15 of imaging sensing device 10. In one embodiment, IR light selective element 25 is affixed to the side portions of package 15 of image sensing device 10 by a thermally stable glue or epoxy. In this manner, IR light selective element or filter 25 is integrated in package 15 and integrated in image sensing device 10.

One advantage of the design of the imaging device of the invention is that it reduces the piece-part count of the total camera system, since package 15 contains the IR filter rather than a system that requires a separate placement of the element or filter. An integrated system also allows a determination and calibration of color performance to be made directly at image sensing device 10, since element or filter 25 is part of image sensing device 10. In other words, the optical characteristics of image sensing device 10 can be encapsulated so as to more greatly control the system light sensing, e.g., color sensing, reproduction, and capability. This is to be compared with prior art systems that required that the optical characteristics of the image sensing device to be determined separately from the optical characteristics of the IR light inhibiting or selective element or filter, since the element or filter was not configured immediately adjacent to or integrated with the image sensing device.

Figure 3:
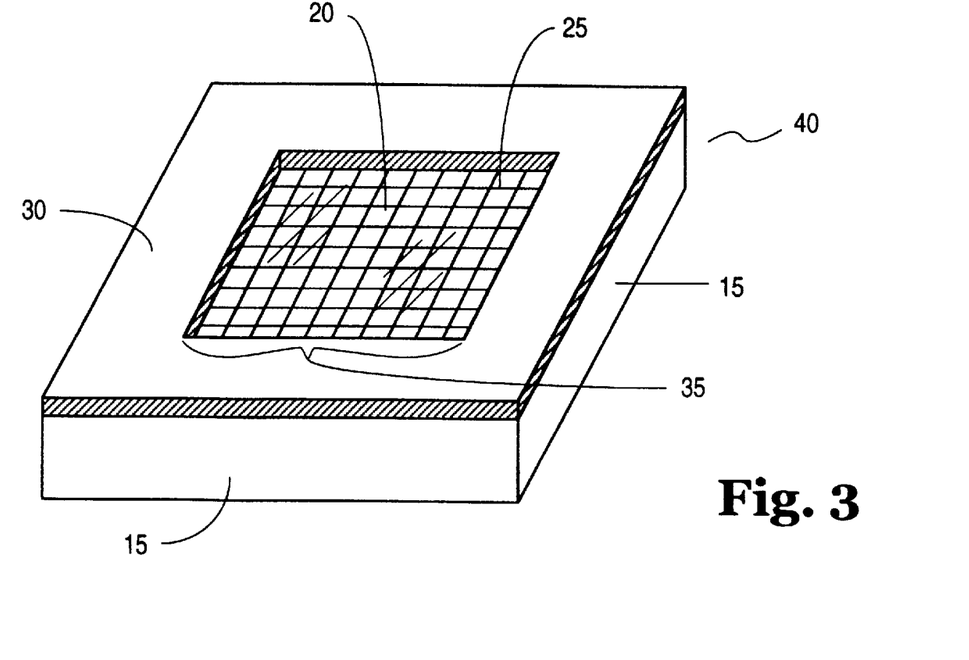
FIG. 3 illustrates a second embodiment of an imaging sensing device in accordance with the invention.

FIG. 3 shows a perspective side view portion of another embodiment of the image sensing device of the invention. In this embodiment, image sensing device 40 includes a package 15, such as a plastic package, housing imaging sensor 20. Overlying and affixed to the top surface of the opposing side wall portions of package 15 by, for example, thermally stable glue or epoxy, is a windowed lid 30. In one embodiment, windowed lid 30 is a ceramic lid.

Windowed lid 30 has an opening 35 into image sensing device 40, the opening having dimensions such that only the light capturing components of image sensor 20 are exposed through opening 35. Disposed in opening 35 and affixed to the inner walls of windowed lid 30, by, for example, thermally stable glue or epoxy, or otherwise integrated into windowed lid 30, is IR light selective element or filter 25. For a similar sized image sensing device as illustrated in FIG. 1, the embodiment illustrated in FIG. 3 uses a smaller, i.e., less surface area, IR light selective substrate or filter.

The advantages of using a windowed lid package such as illustrated in FIG. 3 include a lower system cost since a smaller portion of IR light selective element may be used. The smaller IR light selective element reduces the probability of creating an optical flaw or defect in the manufacture of element 25. The windowed lid also reduces expansion problems introduced by IR light selective element 25, since element 25 is smaller, and expansion due to, for example, temperature changes, is, in general, directly related to the size of element 25. Thus, the risk of cracking of IR light selective element 25 due to expansion is reduced with a smaller element.

Figure 4:
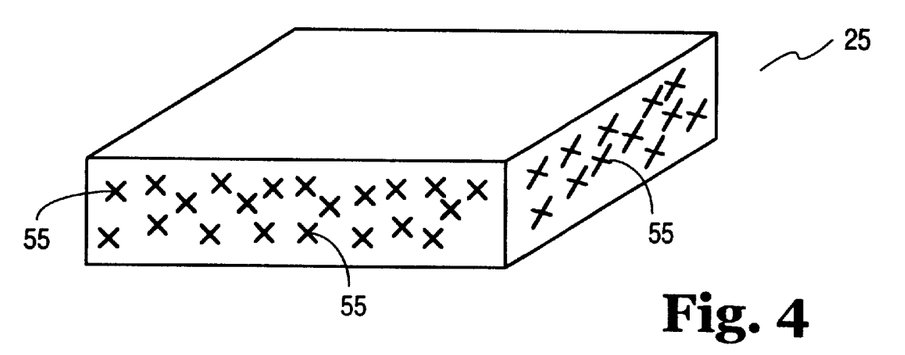
FIG. 4 illustrates an IR light selective element that is a ionically colored glass in accordance with an embodiment of the invention.

In one embodiment, IR light selective element 25 is chemically-doped or ionically-colored glass. FIG. 4 schematically illustrates a top perspective view of an ionically-colored light inhibiting element 25. In FIG. 4, element 25 is doped with an ionic colorant 55, such as for example copper oxide (CuO).

The processes to make IR selective ionically-colored glass are known. These glasses are generally formed by way of a conventional melting process. In one known process, the chemical dopant responsible for creating the ionic coloration, i.e., a colorant such as for example copper oxide (CuO), is combined in a melting process with a component responsible for forming a matrix to support the colorant, such as phosphorous pentoxide ($P_2O_5$), and silicate, borosilicate, or soda-lime glass and other components to form the ionically-colored glass. In one embodiment, a suitable ionically-colored glass is a CM-500™ glass distributed by Hoya Optics of Fremont, Calif., made of the following weight percents: more than 51% $P_2O_5$, 11–20% aluminum oxide, 1–10% lithium oxide, and 1–10% copper oxide. In another embodiment, a suitable ionically-colored glass is BG 39™ distributed by Schott Glass Technologies of Duryea, Pa., made of boron oxide, barium oxide, sodium oxide, potassium oxide, calcium oxide, aluminum oxide, arsenic trioxide, lithium oxide, phosphorous oxide, cerium oxide, and copper oxide.

Ionically-colored glass is potentially more susceptible to interaction with and attack by moisture and other elements than Borosilicate or soda lime glass. This interaction and attack can degrade the surface polish through hydrolization and potentially disrupt the adhesion between the glass and the organic material used to seal the glass to the package or lid. One approach to stabilizing the surface of ionically-colored glass, element, or filter is to overcoat the element with silicon dioxide ($SiO_2$) or other transparent refractory metal oxides, such as titanium oxide ($TiO_2$), by conventional sputtering or evaporation. A coating on the order of, for example, 20–50 Å is sufficient to protect the seal and prevent moisture from penetrating the surface and interacting with the chemical dopants, for example, CuO in the element.

A second approach of protecting the ionically-colored IR selective element from the deleterious effects encountered in the environment, particularly moisture, is to coat the element with a chemical stabilizer. A useful chemical stabilizer is available in the form of adhesion promoters that are used in the integrated circuit wafer fabrication industry as a method for improving the adhesion of photoresist on substrate films. Examples of adhesion promoters include hexamethyldisilizane (HMDS), trimethylsilylacetamide, diethylaminonitrimethylsilane, glycidoxypropyltrimethoxysilane, 3-aminopropyltriethoxysilane, and N-(2-aminoethyl)-3-amino-propyltrimethoxysilane.

The adhesion promoter HMDS, for example, is believed to improve organic photoresist adhesion by chemically reacting on the wafer surface to form a thin monolayer of essentially pure $SiO_2$. This film bonds effectively to the substrate and provides a suitable surface for good resist adhesion. The reaction may be represented as follows:

$$2[Si_s—OH]+(CH_3)_3Si—N(H)—Si(CH_3)_3 \rightarrow 2[Si_s—O—Si(CH_3)_3]+NH_3$$

where "$Si_s$" represents a silicon atom resident in the substrate surface.

Figure 5:
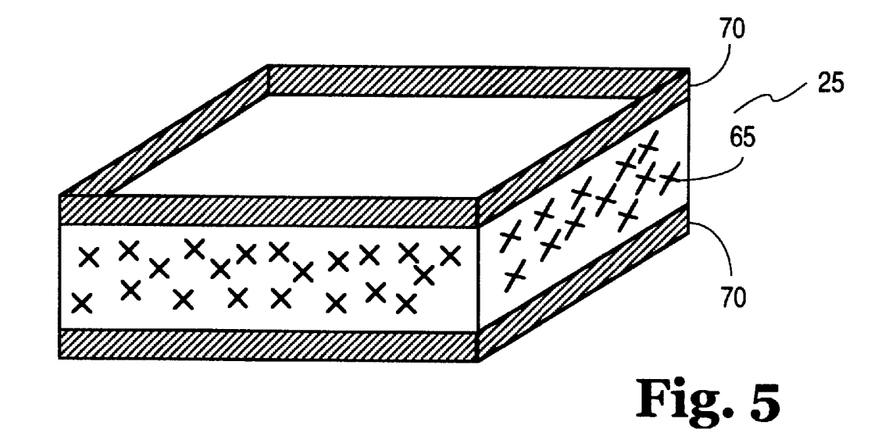
FIG. 5 illustrates an IR light selective element that is a ionically colored glass coated with a chemical stabilizer in accordance with an embodiment of the invention.

According to the invention, ionically-colored element such as glass, that has a component of phosphorous, such as glass doped with ionic colorant CuO, reacts with an adhesion promoter, such as HMDS, to surface treat the glass from exposure to environmental effects such as moisture by forming a thin layer, e.g., 20–50 Å, of SiO2-like material on the surface of the glass. More specifically, the adhesion promoter material reacts to form a siloxane bond with the $SiO_2$ surface, with an organic moiety turned outwards. FIG. 5 illustrates a schematic, top perspective view of IR light selective element 25 consisting of an ionically-colored glass 65 and coated with a thin chemical stabilizer layer 70. During the coating process, multiple surfaces of glass 65 are generally exposed and coated with chemical stabilizer layer 70. It is to be appreciated that care may be taken to prevent a surface from being coated with chemical stabilizer layer 70 if desired.

One advantage to the adhesion promoter approach over sputtering or evaporating to surface treat an ionically-colored element is that it can be carried out in simple, lower cost equipment. Examples include, but are not limited to, glass chambers at atmospheric pressure with a small quantity, approximately 30–50 milliliters, of HMDS liquid as a vapor source, vacuum prime ovens that combine baking (to drive off moisture) with the introduction of HMDS vapor at sub-atmospheric pressure to provide the surface treatment. An example of the treatment in a vacuum prime oven includes baking the substrate in dry nitrogen (100° C., 760–10 Torr, 15 min.) and exposing the substrate to HMDS vapor in vacuum (100° C., 10 Torr, 2 min.), and then pumping/purging the system with dry nitrogen (100° C., 10–760 Torr, 15 min.). The treatment produces a 20–50 Å thick chemical stabilizer layer over the surface of the element or filter.

A second advantage to the adhesion promoter approach is that it is compatible with high cleanliness processing. Surface treatment with HMDS, for example, produces virtually no added defects. Sputtering and evaporation with $SiO_2$ or other transparent refractory metal oxide requires that the equipment be specially designed and carefully operated and maintained to ensure low-defect surfaces.

For a discussion of adhesion promoter treatments in integrated circuit processing, reference is made to Mittal, K. L., "Factors Affecting Adhesion of Lithographic Materials," Solid State Technology, May 1979, at 88–96, Helbert, J. N. & Saha, N., "Application of Silanes for Promoting Resist Patterning Layer Adhesion in Semiconductor Manufacturing," J. Adhesion Sci. Technd., Vol. 5, No. 10, at 905–25 (1991), and Bourtram, M. E., Howard, A. J., Baca, A. G., Shul, R. J., & Rieger, D. J., "A New Method for Promoting Photoresist Adhesion on Tungsten Films for Self-Aligned Refractory Grates on GaAs," J. Electrochem. Soc., Vol. 140, No. 10, at 2998–3000 (October 1993).

It is to be appreciated that the use of an overcoat or chemical stabilizer to protect ionically-colored filter elements is not limited to use with filter elements that are integrated in the image sensing device package. Instead, an ionically-colored filter element placed elsewhere in the optical train can similarly be coated and protected as described herein.

In another embodiment of an IR light selective element or filter, a coated element is used instead of an ionically-colored element. Many chemicals for use as a coating material for glass elements are known. The majority of conventional coating materials are manufactured using the following "inorganic" evaporation chemicals: Titanium dioxide ($TiO_2$), silicon dioxide ($SiO_2$), silicon oxide (SiO), magnesium oxide (MgO), and tantalum pentoxide ($Ta_2O_5$). Coatings manufactured from these materials are highly resistant to damage from abrasion, humidity, corrosive chemicals and solvents, and solar radiation when applied under proper process conditions. These conditions typically include high element or filter temperature, i.e., greater than 200° C., high vacuum free of residual hydrocarbon gases and water vapor, precision substrate penetration, including glow discharge, and reactive gas enriched deposition to form hard coatings.

Figure 6:
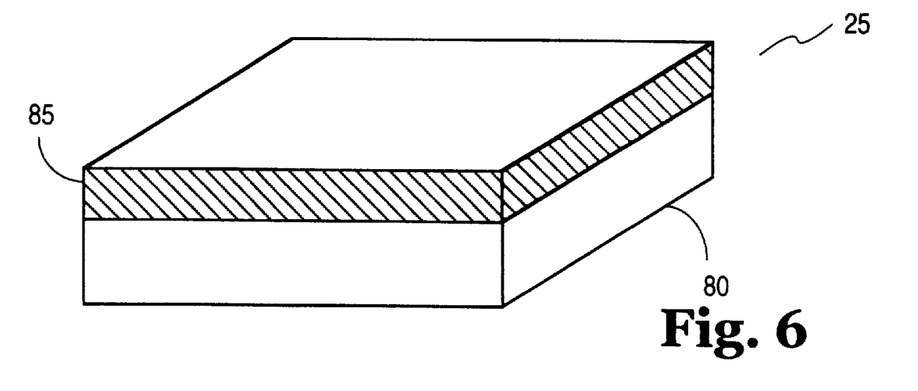
FIG. 6 illustrates an IR light selective element that is a glass coated with a hard coating in accordance with an embodiment of the invention.
Figure 7:
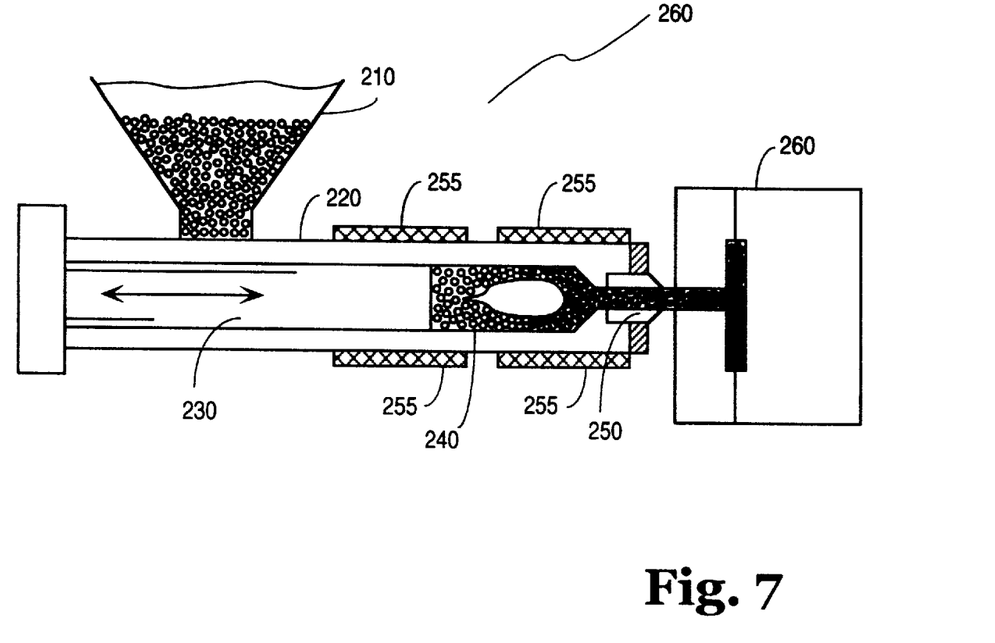
FIG. 7 illustrates an injection-molding device for forming an IR light selective element in accordance with the invention.

FIG. 6 schematically illustrates a top perspective view of an IR light selective element 25 coated with hard coating 85. In an image sensing device such as described with reference to FIGS. 1–3, it is to be appreciated that the coated portion of the IR selective element or filter can face either inside or outside the package.

There are a number of methods of forming IR light selective hard coating elements including, but are not limited to, deposition, evaporation, and lamination. Representative methods are presented below.

One method of forming IR light selective hard coating elements is through an electron-beam evaporation process. In the electron-beam evaporation process, the coating chemical is heated to an evaporation temperature by bombardment with a beam of accelerated electrons. In addition to the high degree of control over the evaporation of the coating chemical, the electron-beam evaporation process provides the ability to achieve extremely high evaporation temperatures.

Another method of forming IR light selective hard coating elements is ion-assisted deposition (IAD). The IAD process utilizes conventional hard coating processes wherein conventionally deposited films are coated over the element, such as glass, and arrive at the element with relatively low energy (approximately 1 ev). This low energy level is considered to be a primary contributor to the formation of columnar, porous crystal structures. The principal function of the IAD process is to bombard the coating material with accelerated ions in an effort to densify the coating. To form the coated element, an element coated with the appropriate material is placed in a coating chamber where the element is exposed to an electrically-charged argon or oxygen gas plasma. When energized, a plasma of high energy particles (approximately 120 eV) flows at the element. As the accelerated ions collide with the coating material which has arrived at the element, the coating material is compacted creating a much denser film structure. Film packing densities of 95% can be achieved using the IAD process compared to a relatively porous, columnar crystal structure exhibited by conventional deposit of the coating material. The packing density constitutes an increase of approximately 15% over the typical density achieved using conventional evaporation processes.

Another method of forming coated IR light selective hard coating elements is through an ion plating process. Ion plating is based upon the principal of electromagnetic attraction. This principal is utilized to achieve uniform, up to 100% dense film layers. Instead of using high kinetic energy to pack coating particles as in the IAD process, the ion plating process relies upon the establishment of electromagnetic attraction of coating particles to the element, such as glass, to form a dense film.

In the ion plating process, a chemically coated element is placed in a chamber equipped with a low-voltage, high-current plasma source which is used to direct a high-current argon plasma at an electron-beam evaporation source. Coating particles become positively charged by the plasma at the point of evaporation. The chamber is designed to allow the formation of a negative electrical charge on the element during processing. The electromagnetic attraction induced by the oppositely charged coating particles and element provide the necessary acceleration to achieve a uniform film with up to 100% film packing density on the substrate.

The processes described above for forming IR light selective hard-coated elements are known in the industry. Reference is made to the processes developed by Corion Corporation, including the STABILIFE™ ion-plating process.

It is to be appreciated that the coated element or filter may be made up of a coating of a single material or a series of coatings of the same or different materials depending on the desired light selectivity requirements. Balzers Thin Films of Golden, Colo. offers several suitable IR light selective hard-coated glass elements, including products marketed under the trade names IRB-1™, IRB-2™, IRB-3™, and Cal-Flex™.

The hard coating materials and processes discussed above related primarily to "inorganic" chemical coatings (e.g., $TiO_2$, $SiO_2$, MgO, $Ta_2O_5$, etc.). Organic compounds, compounds having organic characteristics, or polymers are also contemplated.

The embodiments described above are typically incorporated into or with a glass (e.g., silicon, borosilicate, soda lime, etc.) or glass-like element. Another type of IR selective element contemplated by the invention is a plastic element. In one embodiment, a plastic substrate is made of a plastic colored with dye, such as an organic dye, that is selective to IR light.

There are various methods of making a plastic element selective to IR light, including dispersing the dye throughout a plastic substrate, casting the dye in the plastic substrate, or coating the dye on a plastic substrate.

Figure 8:
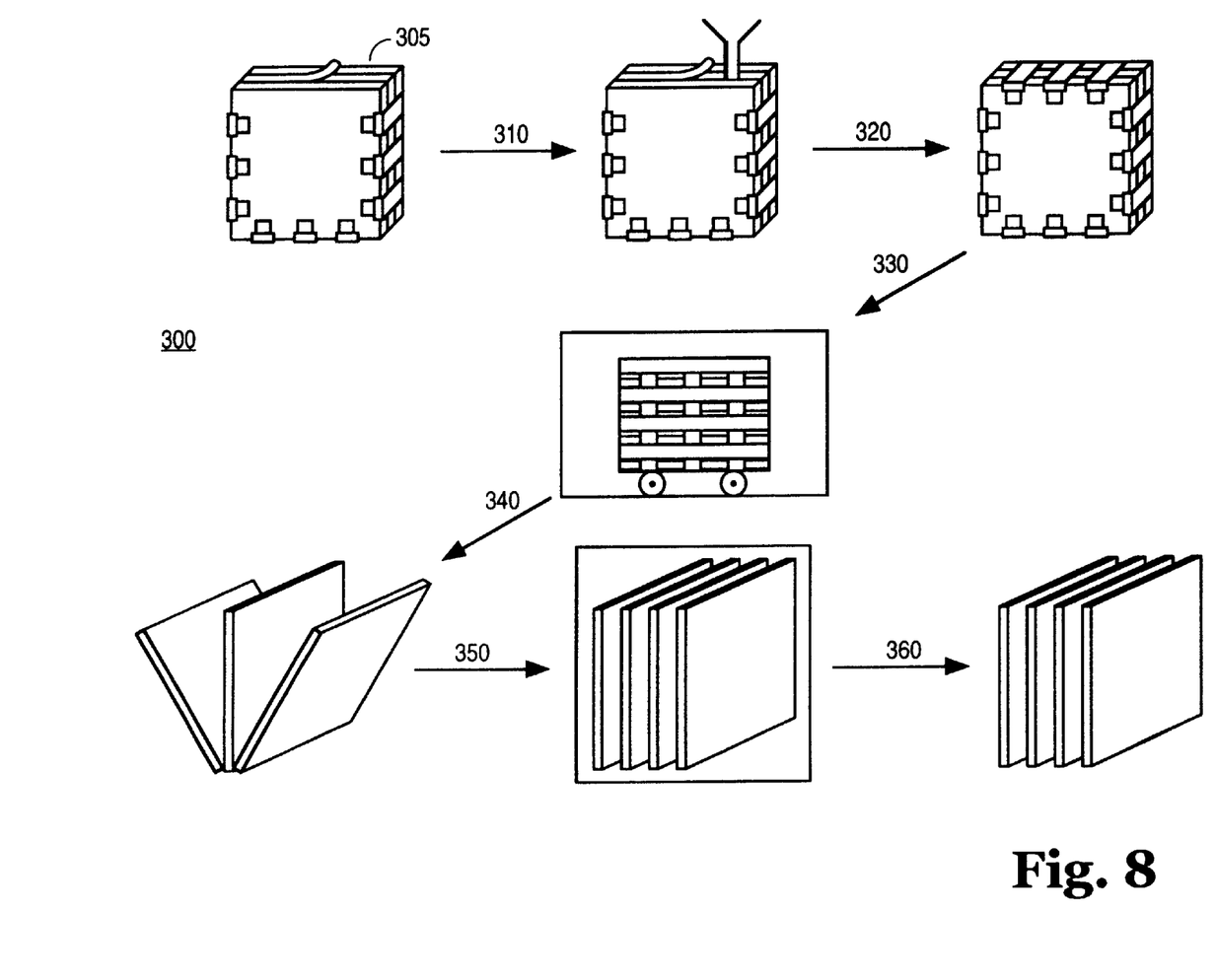
FIG. 8 illustrates a casting method of forming an IR light selective element in accordance with the invention.

Suitable plastic materials that may serve as the plastic element or substrate include, but are not limited to, poly (methyl methacrylate), polycarbonates, or polystyrene. The IR selective dyes include, but are not limited to, dithiolene and phenyldiamine nickel complex types such as shown in Table 1.

form. Methods of mixing include two-roll mills or a Banbury mixer. After mixing, the combined material is injected through a conventional injection molding device such as illustrated in FIG. 8. Injection molding device 200 includes a hopper 210 containing the mixed dye and powder. Hopper 20 feeds the mixed material into injection chamber 240 where the material is melted by heating elements 255 and forced by plunger 230 into nozzle 250. Nozzle 250 discharges the mixed material into mold 260 to form the plastic element.

TABLE 1

Examples of IR Selective Dyes for Filter Applications

| Chemical Structure | Absorption peak, nm $l_{max}$ |
|---|---|
| I. Bis(benzene-1,2-dithiolate) nickel complex: | 890 |
| I. Bis (benzene-1, 2-dithiolate) nickel complex: [structure shown] $N^+(C_4H_9)_4$ | |
| II. Bis(4-dimethylamino)dithiobenzil) nickel complex: | 1070 |
| II. Bis (4-dimethylamino) dithiobenzil) nickel complex: [structure shown] | |
| III. Bis(dithiobenzil) nickel complex: | 860 |
| III. Bis (dithiobenzil) nickel complex: [structure shown] | |
| IV. Phenyldiamine nickel complex: | 790 |
| IV. Phenyldiamine nickel complex: [structure shown] | |

Figure 9:
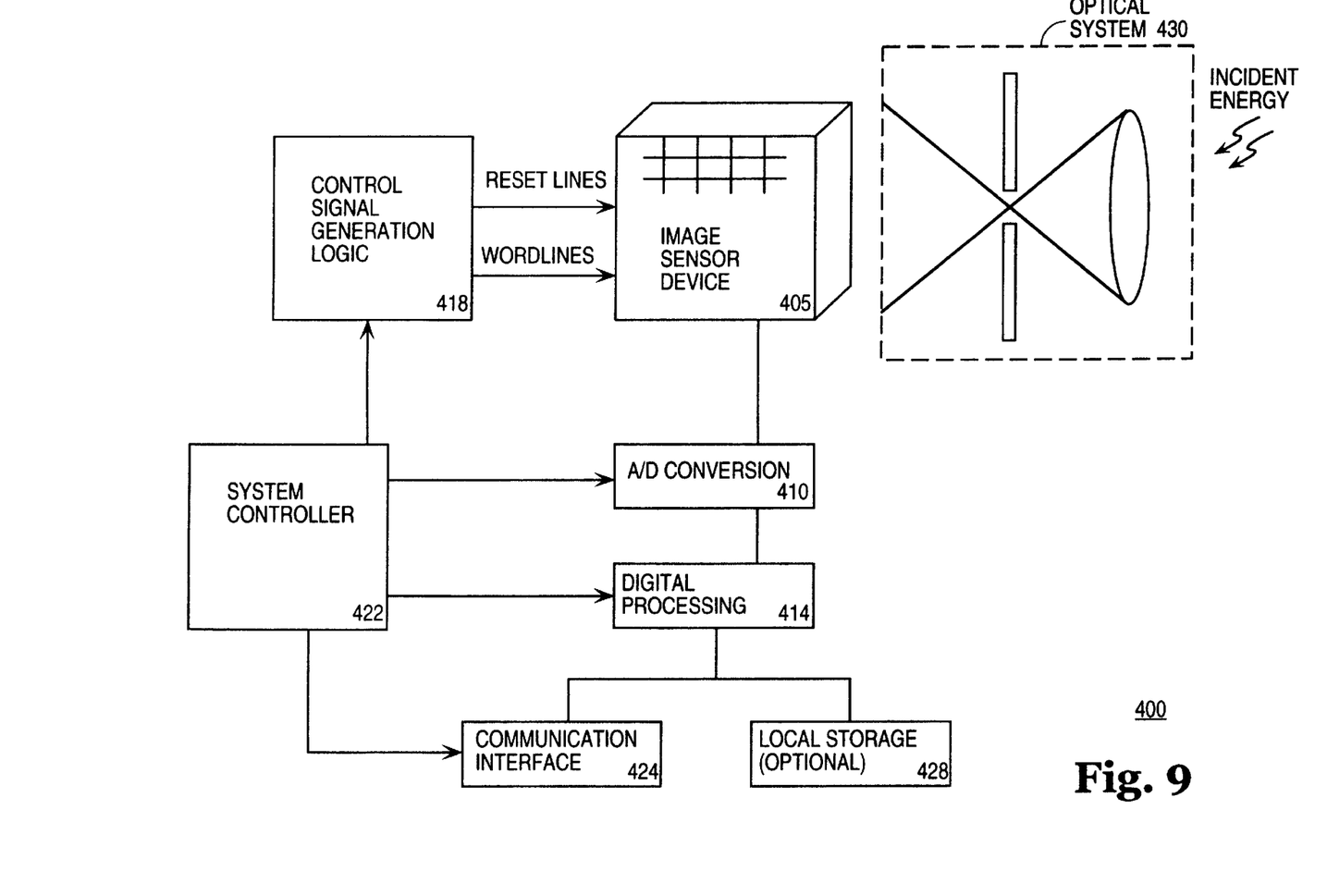
FIG. 9 illustrates an imaging system incorporating an image sensing device according to the invention.

One method of forming an IR light selective plastic element is through injection molding. IR dyes of the type contemplated by the invention are typically supplied in powder form. Thus, the IR dye(s) is/are combined with plastic resins that themselves are typically supplied in pellet Another method of forming an IR selective plastic element is by casting. In this technique, a plastic monomer such as methyl methacrylate monomer, is cast into a sheet and polymerized as shown in FIG. 9. First, in step 300, a mold is prepared in the desired shape. Next, as shown in step 310, mold 305 is filled with the monomer and sealed and clamped (step 320). To reduce the evaporation of the monomer, the monomer is typically mixed with polymers. In the embodiment contemplated by the invention, IR selective dyes are mixed with the monomer/polymer before casting. Small amounts of initiator, mold release agents, and surfactants are added to the monomer/polymer/IR dye mixture. Next, the filled mold is placed in an oven and heated (step 330) for a sufficient period of time to effect polymerization (e.g., 10 hours at 85° C). Mold 305 is then cooled and disassembled (step 340). The cast sheet(s) is/are then annealed and preshrunk (step 350). Finally, the sheet is cooled (step 360) and cut to desired dimensions for lens applications.

A third way of forming the IR selective plastic elements contemplated by the invention is by dip coating. In this technique, the IR dye is mixed with a polymer such as poly(methyl methacrylate) or polycarbonate(s). An element that may be plastic, glass, or other suitable element, is dipped into a solvent system and withdrawn slowly at a controlled speed. The solvent system can contain one solvent or a mixture of solvents with fast, medium, and slow evaporation rates that provide a smooth and even coating. In one embodiment, the viscosity of the solvent system is in the range of 30–100 mpa-sec. The coated element is then heated to approximately 160° C. in the case of a polycarbonate element and 120° C. in the case of a poly(methyl methacrylate) element for thirty minutes to remove the solvent.

Table 1 illustrates various dyes having different absorption peaks. In order to provide the desired IR selectivity spectrum, it may be necessary to mix or combine two or more dyes. An example of a formulation that provides IR selectivity in the range of 650 nanometers to 1,000 nanometers is: 100 parts by weight polycarbonates, 0.2 parts of bis(dithiobenzil) nickel complex, 0.2 parts of phenyldiamine nickel, and 0.1 parts of (4-dimethylamino dithiobenzil) nickel complex for a coating of 2 mils. For a molding application, a formulation is 100 parts by weight polycarbonates, 0.01 parts of bis(dithiobenzil) nickel complex, 0.01 parts of phenyldiamine nickel, and 0.005 parts of bis(4-dimethylamino dithiobenzil) nickel complex for a thickness of 1 millimeter.

The above discussion focused on the inclusion of an IR selective element or filter for use in an image sensing system, such as a camera. In general, applications of such image sensing devices will seek to filter (e.g., reflect or absorb) IR light in the range of 780–1100 nanometers. It is to be appreciated that the element or filter can be made selective to other wavelengths as warranted by the particular application and that the invention should not be limited to elements selective to a specific spectral range. Instead, the principles set forth herein can be applied to applications involving various selectivity concerns.

The sensing device and its alternatives described above may be used as part of a digital imaging system 400 shown in FIG. 9. Imaging system 400 has an optical system 430 that channels the incident energy being light in this case to create an optical image on image sensing device 405. Control signal generation logic 418 is provided to generate the reset signals and wordlines needed to control photocells of the image sensor of image sensing device 405. The output values (sensor signals) may be further processed in analog form before being fed to an analog-to-digital A/D conversion unit 410 that in turn feeds digital processing block 414. Analog signal processing, the A/D unit, and portions of the digital processing block may be located on the same die as the sensor array. The digital processing may include hard-wired logic and/or a programmed processor that performs a variety of digital functions, including preparing digital image data based on the sensor signals for storage or transmission.

Transmission of the image data to an external processing system may be accomplished using communication interface 424. For instance, as a digital camera, system 400 will contain a communication interface that implements a computer peripheral bus standard such as universal serial bus (USB) or IEEE 1394-1995. Imaging system 400 may also contain local storage 428 of the non-volatile variety, for instance including a solid state memory such as a removable memory card, a rotating magnetic disk device, or other suitable memory device for permanent storage of digital image data. The operation of system 400 may be orchestrated by a system controller 422 which may include a conventional microcontroller responding to instructions stored as firmware.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An image sensing device comprising:
   a package having opposing side portions, the package including an imaging sensor within the package having a top side portion; and
   an infrared light selective element coupled to the opposing side portions to form a surface of the package and overlying the top side portion of the imaging sensor.

2. The image sensing device of claim 1, wherein the infrared light selective element is comprised of one of an ionically colored glass, a surface treated glass, and a plastic substrate.

3. An image sensing device comprising:
   a package having opposing side portions, the package including an imaging sensor having a top side portion; and
   a light selective element coupled to the opposing side portions of the package and overlying the top side portion of the imaging sensor, wherein the light selective element is comprised of a glass substrate having a first surface and a second surface, the second surface adjacent the top side portion of the imaging sensor, and an optical coating overlying at least one of the first surface and the second surface.

4. The device of claim 3, the optical coating comprised of one of titanium oxide, silicon oxide, silicon dioxide, magnesium oxide, and tantalum pentoxide.

5. The device of claim 3, wherein the optical coating is comprised of a polymer.

6. The device of claim 3, wherein the optical coating overlies the first surface.

7. An image sensing device comprising:
   a package having opposing side portions, the package including an imaging sensor having a top side portion;
   a lid coupled to the opposing side portions and overlying the top side portion of the imaging sensor, the lid having an opening, the opening exposing the imaging sensor; and
   an infrared light selective element disposed within the opening of the lid, the infrared light selective element comprised of a glass substrate having a first surface and a second surface, an optical coating overlying at least one of the first and the second surface.

8. The device of claim 7, the optical coating comprised of one of titanium oxide, silicon oxide, silicon dioxide, magnesium oxide, and tantalum pentoxide.

9. The device of claim 7, the optical coating comprised of a polymer.

10. The device of claim 7, wherein the optical coating overlies the first surface.

11. An imaging system comprising:

an imaging sensor having a plurality of photocells, the photocells providing sensor signals in response to incident light and control signals, the imaging sensor located in a package having opposing side portions, the package including a light selective element coupled to the opposing side portions and overlying the top side portion of the imaging sensor;

control circuitry configured to generate the control signals for controlling the imaging sensor; and signal processing circuitry for generating image data in response to the sensor signals.

12. The imaging system of claim 11, wherein the light selective element of the package is an infrared light selective element.

13. The imaging system of claim 12, wherein the infrared light selective element is comprised of on e of an ionically, colored glass, a surface treated glass, and a plastic substrate.

14. The imaging system of claim 11, wherein the light selective element is comprised of a glass substrate having a first surface and a second surface and an optical coating overlying at least one of the first surface and the second surface.

15. The imaging system of claim 14, wherein the optical coating of the infrared light selective element is comprised of one of titanium oxide, silicon oxide, silicon dioxide, magnesium oxide, and tantalum pentoxide.

16. The imaging system of claim 14, wherein the optical coating of the infrared light selective element is comprised of a polymer.

17. The imaging system of claim 14, wherein the optical coating of the light selective element overlies the first surface of the glass substrate.

18. An imaging system comprising:

an imaging sensor having a top side portion and a plurality of photocells providing sensor signals in response to incident light and control signals;

a package associated with the imaging sensor having opposing side portions, the package including:

a lid coupled to the opposing side portions and overlying the top side portion of the imaging sensor, the lid having an opening, the opening exposing the imaging sensor, and a light selective element coupled to the lid, the light selective element disposed within the opening of the lid and comprised of a glass substrate having a first surface and a second surface and an optical coating overlying at least one of the first surface and the second surface;

control circuitry configured to generate the control signals for controlling the imaging sensor; and signal processing circuitry for generating image data in response to the sensor signals.

19. The imaging system of claim 18, wherein the light selective element is an infrared light selective element.

20. The imaging system of claim 19, wherein the optical coating of the infrared light selective element is comprised of one of titanium oxide, silicon oxide, silicon dioxide, magnesium oxide, and tantalum pentoxide.

21. The imaging system of claim 19, wherein the optical coating of the infrared light selective element is comprised of a polymer.

22. The imaging system of claim 19, wherein the optical coating of the infrared light selective element overlies the first surface of the glass substrate.

* * * * *

UNITED STATES PATENT AND TRADEMARK OFFICE
CERTIFICATE OF CORRECTION

PATENT NO.    : 6,020,582
DATED         : February 1, 2000
INVENTOR(S)   : Bawolek et al.

It is certified that error appears in the above-identified patent and that said Letters Patent is hereby corrected as shown below:

<u>Column 7 & 8,</u>
Table 1, delete one copy of the duplicates of
"I. Bis(benzene-1,2-dithiolate) nickel complex:",
"II. Bis(4-dimethylamino)dithiobenzil) nickel complex:",
"III. Bis(dithiobenzil) nickel complex:",
"IV. Phenyldiamine nickel complex:", Signed and Sealed this Eighth Day of October, 2002

*Attest:*

JAMES E. ROGAN
*Attesting Officer*    *Director of the United States Patent and Trademark Office*